United States Patent
Tanimura et al.

(10) Patent No.: US 10,364,969 B2
(45) Date of Patent: Jul. 30, 2019

(54) LIGHTING FIXTURE

(71) Applicant: PANASONIC INTELLECTUAL PROPERTY MANAGEMENT CO., LTD., Osaka (JP)

(72) Inventors: Ichirou Tanimura, Osaka (JP); Hiroe Kubo, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 117 days.

(21) Appl. No.: 15/450,403

(22) Filed: Mar. 6, 2017

(65) Prior Publication Data
US 2017/0254521 A1   Sep. 7, 2017

(30) Foreign Application Priority Data
Mar. 7, 2016   (JP) .................... 2016-043867

(51) Int. Cl.
  *F21V 5/08*   (2006.01)
  *F21V 21/26*   (2006.01)
  (Continued)

(52) U.S. Cl.
  CPC ............ *F21V 21/26* (2013.01); *F21K 9/68* (2016.08); *F21V 9/08* (2013.01); *F21V 9/30* (2018.02); *F21V 29/70* (2015.01); *H01S 5/005* (2013.01); *H01S 5/4012* (2013.01); *H01S 5/4087* (2013.01); *F21S 8/04* (2013.01); *F21V 21/025* (2013.01); *F21V 23/002* (2013.01); *F21V 23/02* (2013.01); *F21V 23/06* (2013.01);
  (Continued)

(58) Field of Classification Search
  CPC .......... F21V 21/26; F21V 9/08; H01S 5/4012; F21K 9/68
  See application file for complete search history.

(56) References Cited

U.S. PATENT DOCUMENTS

| | | | |
|---|---|---|---|
| 2006/0034100 A1* | 2/2006 | Schnuckle | B44C 5/06 362/161 |
| 2013/0188388 A1* | 7/2013 | Jaffe | F21V 9/083 362/580 |
| 2016/0033099 A1* | 2/2016 | Bergman | F21S 8/061 362/236 |

FOREIGN PATENT DOCUMENTS

| | | |
|---|---|---|
| JP | 2009-140669 | 6/2009 |
| JP | 2013-214470 | 10/2013 |

(Continued)

OTHER PUBLICATIONS

U.S. Appl. No. 15/450,350 to Ichirou Tanimura et al., filed Mar. 6, 2017.

*Primary Examiner* — Anabel Ton
(74) *Attorney, Agent, or Firm* — Greenblum & Bernstein, P.L.C.

(57) ABSTRACT

A lighting fixture is provided. The lighting fixture includes a fixture body including an elongated shape, a first end, and a second end. A body mount is disposed at a first end side of the fixture body. A light source is accommodated in the fixture body and configured to emit laser light. A power supply is accommodated in the fixture body and electrically connected to the light source. A light guide includes an entrance end and an exit end. The entrance end is optically connected to the light source. The light guide is configured to guide the laser light from the light source to the exit end. A lamp is disposed at a second end side of the fixture body and optically connected to the exit end of the light guide.

19 Claims, 5 Drawing Sheets

(51) Int. Cl.
  *F21V 9/30*      (2018.01)
  *F21V 29/70*     (2015.01)
  *F21K 9/68*      (2016.01)
  *F21V 9/08*      (2018.01)
  *H01S 5/40*      (2006.01)
  *H01S 5/00*      (2006.01)
  *F21Y 115/30*        (2016.01)
  *F21V 23/00*         (2015.01)
  *F21V 23/02*         (2006.01)
  *F21V 23/06*         (2006.01)
  *F21V 8/00*          (2006.01)
  *F21S 8/04*          (2006.01)
  *F21V 21/02*         (2006.01)
  *H01S 5/022*         (2006.01)
  *H01S 5/323*         (2006.01)

(52) U.S. Cl.
  CPC ......... *F21Y 2115/30* (2016.08); *G02B 6/0006* (2013.01); *G02B 6/0008* (2013.01); *H01S 5/02284* (2013.01); *H01S 5/32341* (2013.01)

(56) References Cited

FOREIGN PATENT DOCUMENTS

| | | |
|---|---|---|
| JP | 2014-146503 | 8/2014 |
| JP | 2015-088428 | 5/2015 |

\* cited by examiner

LIGHTING FIXTURE

CROSS REFERENCE TO RELATED APPLICATION

This application claims the benefit of priority of Japanese Patent Application Number 2016-043867 filed on Mar. 7, 2016, the entire content of which is hereby incorporated by reference.

BACKGROUND

1. Technical Field

The present disclosure relates to a lighting fixture using laser light.

2. Description of the Related Art

A conventional lighting fixture, for example, a spotlight lighting fixture, is used at a shop, museum, or art museum to provide spot lighting for objects such as goods for sale or work pieces. Such a spotlight lighting fixture is used in electrical and mechanical connection with a lighting duct installed on the ceiling (e.g., see Patent Literature 1: Japanese Unexamined Patent Application Publication No. 2014-146503).

The lighting fixture disclosed in Patent Literature 1 includes a power box including a power supply circuit therein, an arm having one end attached to the power box, and a lamp attached to the other end of the arm and including a lighting source therein. The power box included in the lighting fixture disclosed in Patent Literature 1 is secured to the lighting duct. A connection between the arm of the lighting fixture and the lamp and a connection between the power box and the arm are angularly adjustable. A user is allowed to flexibly change a direction of emission of light from the lamp by adjusting the angle of each of the connections as appropriate.

SUMMARY

However, the placement of the lamp included in the lighting fixture disclosed in Patent Literature 1 is limited to a location directly below the lighting duct. Thus, the lamp may not be placed at a desired location.

Thus, the present disclosure provides a lighting fixture which includes a lamp that emits light, and also provides an enhanced freedom of placement of the lamp.

In order to solve the above problem, one aspect of the lighting fixture according to the present disclosure is a lighting fixture including: a fixture body including an elongated shape, a first end, and a second end; a body mount disposed at a first end side of the fixture body; a light source accommodated in the fixture body and configured to emit laser light; a power supply accommodated in the fixture body and electrically connected to the light source; a light guide including an entrance end and an exit end, the entrance end being optically connected to the light source, the light guide configured to guide the laser light from the light source to the exit end; and a lamp disposed at a second end side of the fixture body and optically connected to the exit end of the light guide.

According to the present disclosure, a lighting fixture which includes a lamp provides an enhanced freedom of placement of the lamp.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

Hereinafter, an embodiment of the present disclosure is described with reference to the accompanying drawings. The embodiment described below is a merely one specific example of the present disclosure. Thus, values, shapes, materials, components, and arrangement and connection between the components, etc. shown in the following embodiment are merely by way of illustration and not intended to limit the present disclosure. Therefore, among the components in the embodiment below, components not recited in any one of the independent claims defining the most generic part of the inventive concept of the present disclosure are described as arbitrary components.

The figures are schematic views and do not necessarily illustrate the present disclosure precisely. In the figures, the same reference sign is used to refer to substantially the same configuration, and duplicate description is thus omitted or simplified.

Embodiment

[1. Overall Configuration]

Initially, a configuration of a lighting fixture according an embodiment of the present disclosure is described with reference to the accompanying drawings.

Figure 1:
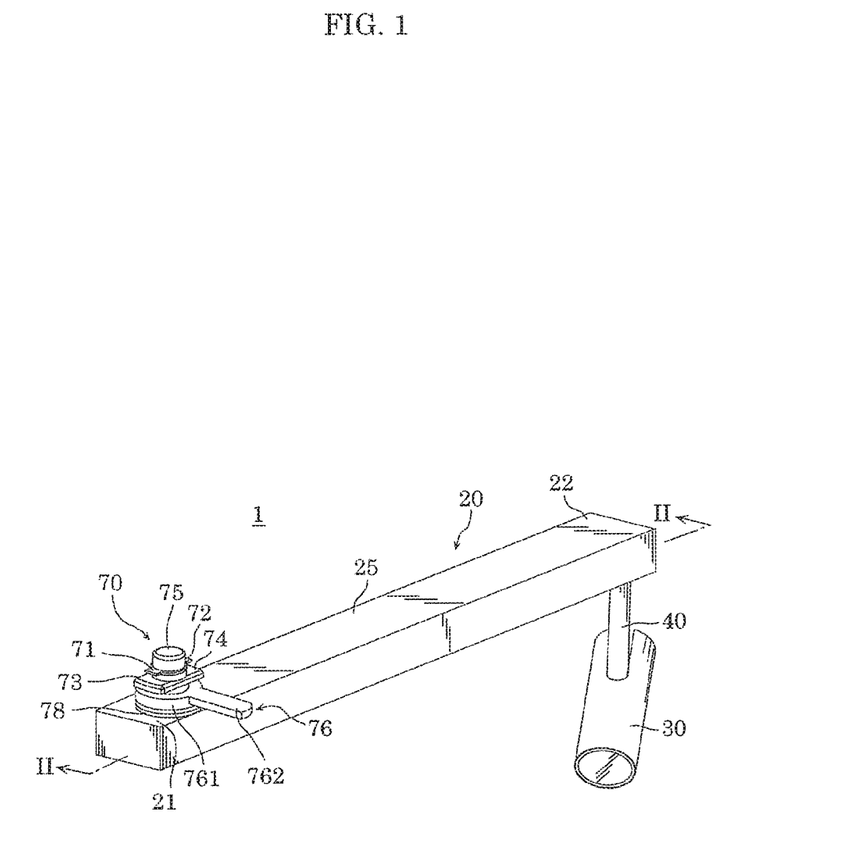
FIG. 1 is a perspective view of an appearance of a lighting fixture according to an embodiment of the present disclosure.

FIG. 1 is a perspective view of an appearance of lighting fixture 1 according to the present embodiment.

Figure 2:
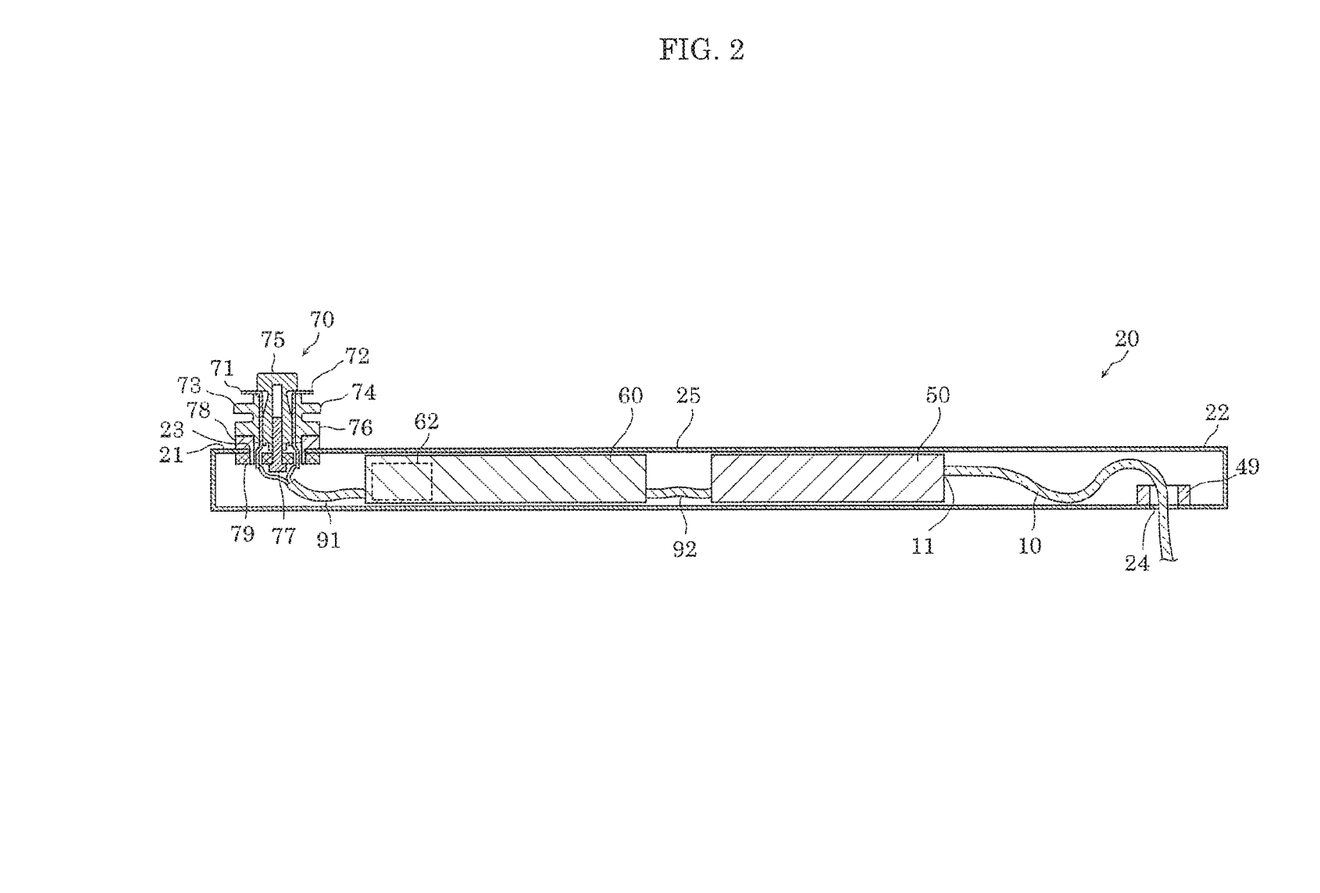
FIG. 2 is a cross-sectional view of an internal structure of a fixture body of the lighting fixture according to the embodiment.

FIG. 2 is a cross-sectional view of an internal structure of fixture body 20 included in lighting fixture 1 according to the present embodiment, taken along a line II-II in FIG. 1.

Figure 3:
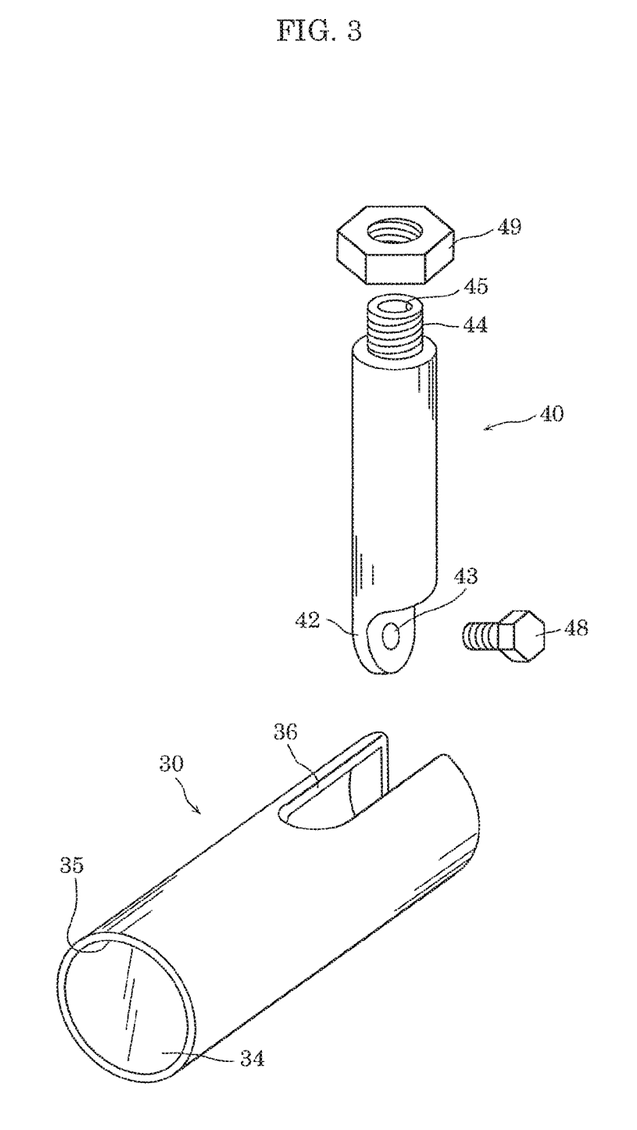
FIG. 3 is an exploded perspective view of configurations of a lamp and a support stem included in the lighting fixture according to the embodiment.

FIG. 3 is an exploded perspective view of configurations of lamp 30 and support stem 40 included in lighting fixture 1 according to the present embodiment.

Figure 4:
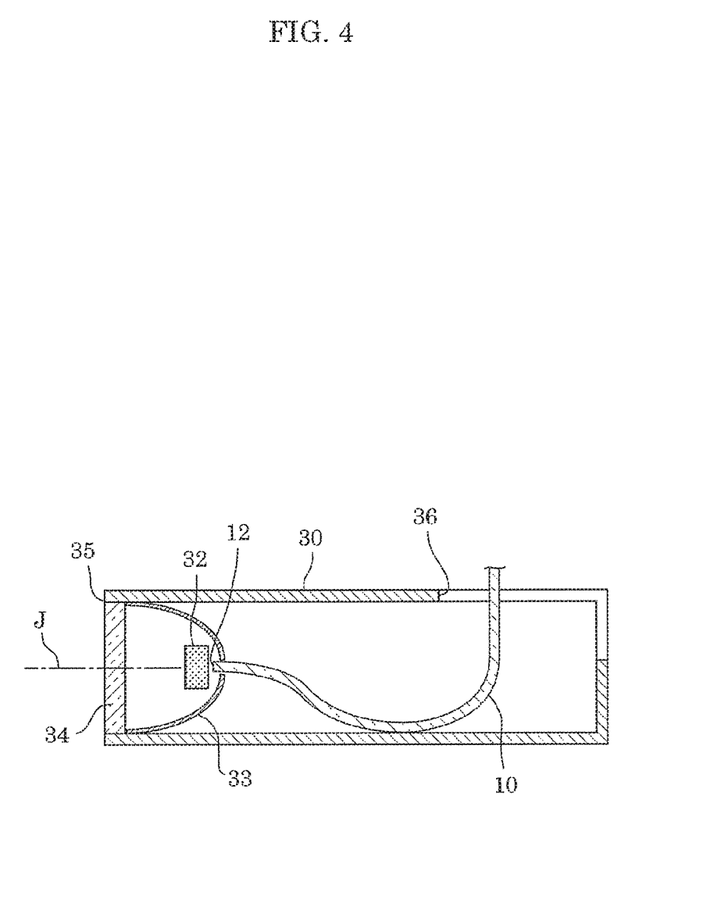
FIG. 4 is a cross-sectional view of configurations of the lamp and a light guide included in the lighting fixture according to the embodiment.

FIG. 4 is a cross-sectional view of configurations of lamp 30 and light guide 10 included in lighting fixture 1 according to the present embodiment, taken along a line through optical axis J of lamp 30.

As illustrated in FIG. 1, lighting fixture 1 according to the present embodiment is a spotlight lighting fixture. Lighting fixture 1 includes fixture body 20, lamp 30, and support stem 40. As illustrated in FIG. 2, lighting fixture 1 further includes light source 50, power supply 60, and light guide 10 in fixture body 20. In the following, each of the components included in lighting fixture 1 is described.

[1-1. Fixture Body]

Fixture body 20 is, as illustrated in FIG. 1, an elongated member having first end 21 and second end 22, and includes body mount 70 on first end 21. In the present embodiment, fixture body 20 includes, as illustrated in FIG. 2, elongated housing 25 in which light source 50 and power supply 60 are accommodated. Fixture body 20 may, but not limited to, have a length of 0.2 m or more and 1 m or less, for example.

First end 21 and second end 22 of fixture body 20 have structures for attaching body mount 70 and support stem 40, respectively, thereto. In the present embodiment, as illustrated in FIG. 2, first end 21 and second end 22 of fixture body 20 have through-hole 23 and through-hole 24, respectively, as the structures. Fixture body 20 is mounted on a lighting duct at body mount 70.

A material from which housing 25 of fixture body 20 is formed is not particularly limited. Housing 25 of fixture body 20 is formed of a metallic material such as aluminum alloy, for example.

In fixture body 20, the center of gravity of light source 50 and the center of gravity of power supply 60 are located offset toward first end 21 from the longitudinal center of fixture body 20. In lighting fixture 1 according to the present embodiment, first end 21 of fixture body 20 is held by body mount 70. Thus, a force that is applied to body mount 70 by fixture body 20 can be reduced by positioning the center of gravity of fixture body 20 closer to first end 21 than second end 22. This obviates the need for a reinforcement member or the like in body mount 70, thereby simplifying the configuration of body mount 70.

Body mount 70 is used to mount fixture body 20 on a mounted part. Body mount 70 pivotally mounts fixture body 20 on the mounted part. In the present embodiment, the mounted part is the lighting duct, and body mount 70 pivotally mounts fixture body 20 on the lighting duct. Body mount 70 includes, as illustrated in FIG. 1, electrode plates 71 and 72, locking portions 73 and 74, mounting shaft 75, operating member 76, and spacer 78. Body mount 70 also includes, as illustrated in FIG. 2, thread 77 and securing member 79.

Mounting shaft 75 serves as an axis of rotation of body mount 70. Mounting shaft 75 has a cylindrical shape. Body mount 70 is formed pivotable about the central axis of cylindrical mounting shaft 75. A material from which mounting shaft 75 is formed is not particularly limited. Mounting shaft 75 is formed of a resin material such as polycarbonate, for example.

Electrode plates 71 and 72 are planar electrodes and receive AC power from the lighting duct. As illustrated in FIGS. 1 and 2, electrode plates 71 and 72 are planar members extending perpendicular to the central axis of cylindrical mounting shaft 75 in opposite directions from mounting shaft 75. Electrode plates 71 and 72 are made in contact with a power rail which is provided in the lighting duct to supply power to electrode plates 71 and 72 while body mount 70 is mounted on the lighting duct. This applies the AC voltage from the lighting duct to electrode plates 71 and 72. Electrode plates 71 and 72, as illustrated in FIG. 2, extend from body mount 70 into fixture body 20 and are connected to electrical wire 91. The AC voltage applied to electrode plates 71 and 72 is applied to power supply 60 via electrical wire 91. Materials from which electrode plates 71 and 72 are formed are not particularly limited, insofar as electrode plates 71 and 72 are conductive members. Electrode plates 71 and 72 are formed of metallic materials such as copper, for example.

Locking portions 73 and 74 are plate members which are locked in a locking groove in the lighting duct. As illustrated in FIGS. 1 and 2, locking portions 73 and 74 are planar members extending perpendicular to the central axis of cylindrical mounting shaft 75 in opposite directions from mounting shaft 75. Materials from which locking portions 73 and 74 are formed are not particularly limited. Locking portions 73 and 74 are formed of insulating materials, such as polycarbonate, for example.

Operating member 76 causes electrode plates 71 and 72 and locking portions 73 and 74 to pivot about the central axis of mounting shaft 75. Operating member 76 includes, as illustrated in FIG. 1, cylindrical portion 761 and protrusion 762 projecting substantially perpendicular to the central axis of mounting shaft 75 from cylindrical portion 761. Operating member 76 is integrally formed with electrode plates 71 and 72 and locking portions 73 and 74. This allows protrusion 762 of operating member 76 to be caused to pivot about the central axis of mounting shaft 75, thereby causing electrode plates 71 and 72 and locking portions 73 and 74 to pivot about the central axis of mounting shaft 75. A material from which operating member 76 is formed is not particularly limited. Operating member 76 is formed of an insulating material such as polycarbonate, for example.

Spacer 78 is disposed between operating member 76 and fixture body 20. Spacer 78 is not integral with operating member 76. This allows operating member 76 to be pivotable about spacer 78. A material from which spacer 78 is formed is not particularly limited. Spacer 78 is formed of an insulating material such as polycarbonate, for example.

Securing member 79 is disposed in fixture body 20 and secures body mount 70 to fixture body 20. Securing member 79 has a disc shape having an outer diameter greater than through-hole 23. Securing member 79 has a through-hole formed in the center. The through-hole passes thread 77 therethrough. Securing member 79 also has through-holes through which electrode plates 71 and 72 are inserted. A material from which securing member 79 is formed is not particularly limited. Securing member 79 is formed of an insulating material such as polycarbonate, for example.

Thread 77 secures body mount 70. Thread 77 is threaded from the interior of fixture body 20 through the through-hole in securing member 79 into a threaded hole formed in mounting shaft 75.

To mount body mount 70 on the lighting duct, initially, electrode plates 71 and 72 (and locking portions 73 and 74) are arranged side by side in parallel with a groove in the lighting duct. Next, while maintaining the above arrangement, cylindrical mounting shaft 75, electrode plates 71 and 72, and locking portions 73 and 74 are inserted into the groove in the lighting duct. Then, while mounting shaft 75, etc. being inserted in the groove in the lighting duct, operating member 76 is caused to pivot by approximately 90 degrees about mounting shaft 75. Locking portions 73 and 74 are thus locked in the locking groove in the lighting duct, thereby securing body mount 70 to the lighting duct. Here, fixture body 20 is mounted on body mount 70 in a manner pivotable about mounting shaft 75. Accordingly, fixture body 20 is pivotable relative to the lighting duct about mounting shaft 75 while lighting fixture 1 is mounted on the lighting duct.

[1-2. Power Supply]

Power supply 60 is a circuit accommodated in fixture body 20 and electrically connected to light source 50. In the present embodiment, power supply 60 converts the AC power supplied from the lighting duct into DC power and supplies the DC power to light source 50 via electrical wire 92. Power supply 60 includes, for example, a printed circuit board and electronic components mounted on the printed circuit board. The electronic components mounted on the circuit board are for causing light source 50 to emit laser light, and include transformer 62 illustrated in FIG. 2, for example. Besides transformer 62, the electronic components include a capacitor such as an electrolytic capacitor or ceramic capacitor, a resistance element such as a resistor, a rectifying circuit element, a coil element, a noise filter, a semiconductor device such as an integrated circuit element or diode, etc. It should be noted that power supply 60 may further include a dimming circuit or boost circuit, for example.

In the present embodiment, among the electronic components that are included in power supply 60, the heaviest electronic component is offset toward one end of power supply 60 from the center of power supply 60 in the longitudinal direction of fixture body 20, the end being closer to first end 21 than second end 22. This positions the center of gravity of fixture body 20 to the body mount 70 side (i.e., the first end 21 side), thereby reducing a moment force which is applied to body mount 70 by fixture body 20. This obviates the need for a reinforcement member or the like in body mount 70, thereby simplifying the configuration of body mount 70.

In the present embodiment, transformer 62 is the heaviest electronic component among the electronic components included in power supply 60.

[1-3. Light Source]

Light source 50 is accommodated in fixture body 20 and emits laser light. In the present embodiment, light source 50 includes a semiconductor laser which emits the laser light. This achieves a reduction in size of light source 50. The semiconductor laser included in light source 50 is, for example, a nitride semiconductor laser that is fabricated using nitride semiconductor. Laser light emitted by light source 50 is, but not particularly limited to, blue light having a wavelength of 420 nm or more and 500 nm or less, for example. The laser light emitted by light source 50 is guided to lamp 30 via light guide 10.

Light source 50 includes a heat dissipator which dissipates heat caused by the semiconductor laser. The heat dissipator is directly connected or indirectly connected to the semiconductor laser via a member that has high thermal conductivity. The heat dissipator is formed using, for example, a material that has high thermal conductivity such as aluminum. As such, although light source 50 includes relatively large, heavy members such as the heat dissipator, light source 50 is disposed in fixture body 20 in lighting fixture 1, thereby allowing a reduction in size and weight of lamp 30. In other words, the center of gravity of lighting fixture 1 can be prevented from being positioned closer to second end 22 than first end 21. Thus, the moment force which is applied to body mount 70 disposed on first end 21 can be reduced. This obviates the need for a reinforcement member or the like in body mount 70, thereby simplifying the configuration of body mount 70. Alternatively, light source 50 may have the center of gravity located very close to first end 21 of fixture body 20. For example, in light source 50, the heat dissipator may be offset toward an end of light source 50 from the center of light source 50 in the longitudinal direction of fixture body 20, the end being closer to first end 21 than second end 22.

[1-4. Support Stem]

Support stem 40 is disposed at second end 22 of fixture body 20 and includes lamp connection 42 (see FIG. 3) to which lamp 30 is pivotally connected. As such, lamp 30 can be caused to pivot about support stem 40, thereby enhancing an orientational degree of freedom of illumination light emitted by lamp 30. As illustrated in FIG. 3, support stem 40 includes body connection 44 to which fixture body 20 is connected pivotally about support stem 40. In the present embodiment, support stem 40 is in a cylindrical shape and has lamp connection 42 at one end and body connection 44 at the other end. Support stem 40 also has insertion hole 45 formed passing through along the longitudinal direction of support stem 40.

The configuration of lamp connection 42 is not particularly limited insofar as the configuration allows lamp 30 to be pivotally connected to support stem 40. However, in the present embodiment, through-hole 43 is formed in lamp connection 42. Bolt 48 illustrated in FIG. 3 is inserted into through-hole 43. Bolt 48 is threaded via through-hole 43 into a threaded hole (not shown) formed in the interior of light source 50. This allows lamp 30 to be connected to support stem 40 pivotally about the axis of rotation of bolt 48.

The configuration of body connection 44 is not particularly limited insofar as the configuration allows fixture body 20 to be pivotally connected to support stem 40. However, in the present embodiment, a screw thread is formed at body connection 44. Body connection 44 is inserted into through-hole 24 in fixture body 20 and threaded into nut 49. This pivotally connects fixture body 20 to cylindrical support stem 40 about the central axis of support stem 40.

Insertion hole 45 is a thorough-hole which passes light guide 10 therethrough. Insertion hole 45 is extending from body connection 44 to lamp connection 42 of support stem 40. Light guide 10 is disposed in insertion hole 45. This can prevent light guide 10 from being exposed out of lighting fixture 1, thereby reducing damage to light guide 10. The prevention of the exposure of light guide 10 is also preferable in terms of aesthetics of lighting fixture 1.

A material from which support stem 40 is formed is not particularly limited. Support stem 40 is formed of, for example, a metallic material such as aluminum or a resin material such as polycarbonate, for example.

[1-5. Light Guide]

Light guide 10, as illustrated in FIG. 2, has entrance end 11 and exit end 12 (see FIG. 4). Entrance end 11 is optically connected to light source 50 and guides the laser light emitted by light source 50 to exit end 12. In the present embodiment, light guide 10 is an optical fiber. As illustrated in FIG. 2, entrance end 11 of light guide 10 is connected to light source 50. Laser light emitted by light source 50 enters entrance end 11, propagates in the interior of light guide 10, and exits through exit end 12. Light guide 10 is formed using, for example, a light transmissive material such as quartz.

[1-6. Lamp]

Lamp 30 is, as illustrated in FIG. 1, disposed to a second end 22 side of fixture body 20 in the longitudinal direction, and, as illustrated in FIG. 4, optically connected to exit end 12 of light guide 10. Laser light enters lamp 30 via light guide 10 and illumination light is emitted by lamp 30 through opening 35 illustrated in FIGS. 1 and 4. In this manner, in lighting fixture 1 according to the present embodiment, the laser light emitted by light source 50 is guided to lamp 30 via light guide 10. In other words, light source 50 is not disposed in lamp 30. For this reason, the size and weight of lamp 30 included in lighting fixture 1 can be reduced. Since lamp 30 is connected to second end 22 of fixture body 20, the reduction in weight of lamp 30 allows the center of gravity of lighting fixture 1 to be located at a position close to first end 21. Thus, the moment force which is applied to body mount 70 by fixture body 20 can be reduced in lighting fixture 1. The reduction in weight of lamp 30 also allows a reduction in required mechanical strength of support stem 40. This allows a reduction in weight of support stem 40, thereby allowing the center of gravity of lighting fixture 1 to be located at a position close to first end 21.

The reduction in size of lamp 30 can also make presence of lamp 30 less conspicuous in an illuminated space. In other words, lighting fixture 1 that takes to the illuminated space is achieved.

Lamp 30 has side opening 36 formed therein. Lamp connection 42 of support stem 40 is inserted in side opening 36. Lamp 30 is pivotally connected to lamp connection 42 of support stem 40. In the present embodiment, a threaded hole (not shown) into which bolt 48 is threaded is formed in the interior of lamp 30. Bolt 48 inserted in through-hole 43 in support stem 40 is threaded into the threaded hole. This pivotally connects lamp 30 to support stem 40.

Lamp 30 has a cylindrical shape having opening 35, and includes optical member 34 disposed in opening 35. Lamp 30, as illustrated in FIG. 4, also includes wavelength converter 32 and reflective member 33 therein.

Wavelength converter 32 converts a wavelength of the laser light supplied from light source 50 via light guide 10. Wavelength converter 32 is secured to the interior of reflective member 33. Wavelength converter 32 converts a wavelength of at least a portion of the laser light passed through exit end 12 of light guide 10, and emits light. Wavelength converter 32 includes, for example, phosphor which absorbs laser light and converts the laser light into phosphor light having a long wavelength. A material from which the phosphor is made is selected according to a wavelength spectrum of the laser light and wavelength spectrum of illumination light which is emitted by lighting fixture 1. For example, if the laser light has a wavelength of 420 nm or more and 500 nm or less and lighting fixture 1 emits white light, yellow phosphor is used whose primary wavelength range is from 540 nm to 610 nm and upper limit of the wavelength range is about 660 nm.

Reflective member 33 controls distribution of the light emitted by wavelength converter 32. It should be noted that the light emitted by wavelength converter 32 includes not only the phosphor, which is the light having a wavelength converted by wavelength converter 32, but also scattered light, caused by wavelength converter 32, of the laser light passed through exit end 12 of light guide 10. In the present embodiment, reflective member 33 reflects, to optical member 34, the light emitted by wavelength converter 32. Reflective member 33 is a tubular member having an opening passing through optical axis J.

The inner diameter of reflective member 33, as illustrated in FIG. 4, gradually increases from one end where exit end 12 of light guide 10 is disposed to the other end where optical member 34 is disposed. The light emitted by wavelength converter 32 reflects off the inner surface of reflective member 33.

Reflective member 33 can be formed of, for example, a rigid white resin material such as polybutylene terephthalate. It should be noted that a film made of metal such as aluminum may be disposed on the inner surface of reflective member 33.

Optical member 34 is a light transmissive member and has a light incident surface on which the light from reflective member 33 is incident, and a light exit surface through which the light incident on the light incident surface exits optical member 34. Optical member 34 may have a function of controlling the distribution of the light from reflective member 33 and transmits the light therethrough. For example, optical member 34 may be a Fresnel lens. This allows lighting fixture 1 to collect outgoing light to form a spot-like illumination area.

Optical member 34 is formed using a light-transmissive material. For example, optical member 34 is formed using a transparent resin material such as acrylic or polycarbonate, or a light transmissive material such as a glass material.

[2. Use]

Next, use of lighting fixture 1 according to the present embodiment is described with reference to the accompanying drawings.

Figure 5:
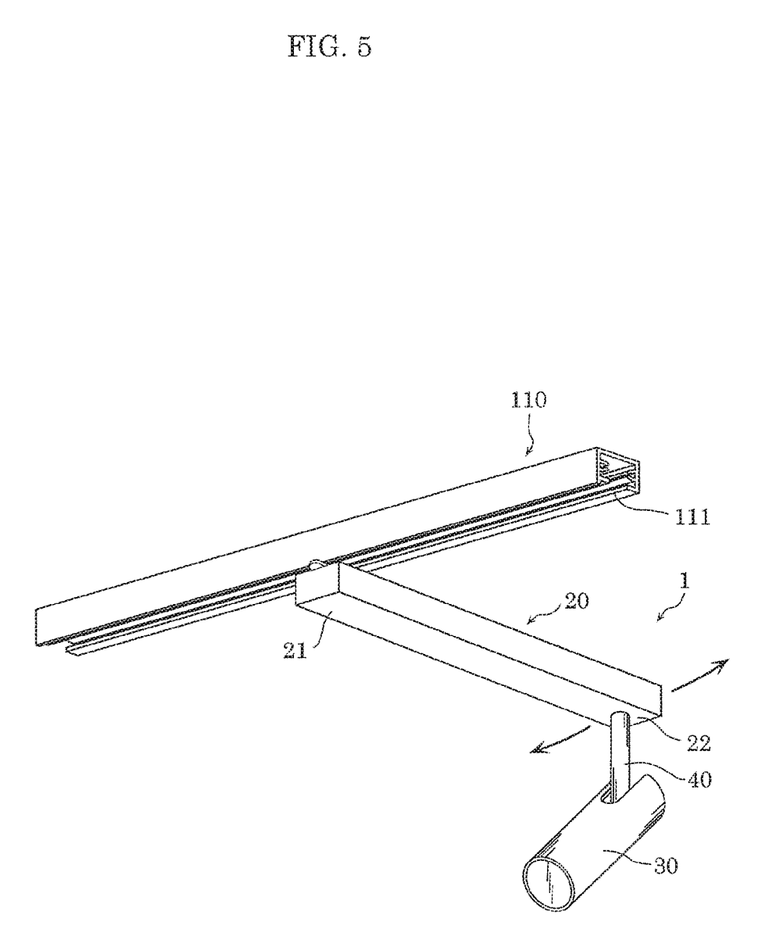
FIG. 5 is a perspective view illustrating use of the lighting fixture according to the embodiment.

FIG. 5 is a perspective view illustrating an example of use of lighting fixture 1 according to the present embodiment.

As illustrated in FIG. 5, lighting fixture 1 is mounted on lighting duct 110 at first end 21 of fixture body 20. Although not shown in FIG. 5, it should be noted that body mount 70 disposed on first end 21 of fixture body 20 is inserted in groove 111 in lighting duct 110. Lighting fixture 1 is mounted on lighting duct 110 at body mount 70. Moreover, as described above, lighting fixture 1 is pivotally mounted on lighting duct 110 at body mount 70. This allows second end 22 of lighting fixture 1 and lamp 30 connected to second end 22 to be pivotable about body mount 70. In other words, lamp 30 is pivotable about body mount 70 in the directions indicated by the two arrows in FIG. 5.

As described above, lighting fixture 1 allows lamp 30 to be placed at a location other than directly below body mount 70 of lighting fixture 1. In the use aspect illustrated in FIG. 5, lamp 30 can be placed either at a location directly below lighting duct 110 or a location other than the location directly below lighting duct 110. In other words, lighting fixture 1 according to the present embodiment provides an enhanced freedom of placement of lamp 30. For example, in the case where lighting fixture 1 is used at a shop, lighting fixture 1 can not only emit illumination light to goods for sale from directly above, which are arranged directly below lighting duct 110, but also emit illumination light to goods for sale from directly above, which are arranged at locations other than directly below lighting duct 110.

[3. Summary]

As described above, lighting fixture 1 according to the present embodiment includes: fixture body 20 including an elongated shape, first end 21, and second end 22; body mount 70 disposed at a first end side of fixture body 20; light source 50 accommodated in fixture body 20 and configured to emit laser light; power supply 60 accommodated in fixture body 20 and electrically connected to light source 50; light guide 10 including entrance end 11 and exit end 12, entrance end 11 being optically connected to light source 50, light guide 10 configured to guide the laser light from light source 50 to exit end 12; and lamp 30 disposed at a second end side of fixture body 20 and optically connected to exit end 12 of light guide 10.

Accordingly, lighting fixture 1 can allow lamp 30 to be placed at a location other than directly below body mount 70 of lighting fixture 1. In other words, enhanced freedom of placement of lamp 30 can be provided. Moreover, since light source 50 included in lighting fixture 1 is disposed in fixture body 20, rather than in lamp 30, the size of lamp 30 can be reduced. This can make presence of lamp 30 less conspicuous in an illuminated space. In other words, lighting fixture 1 that takes to the illuminated space is achieved.

Moreover, in lighting fixture 1, light source 50 may include a semiconductor laser.

This achieves a reduction in size of light source 50.

Alternatively, light source 50 included in lighting fixture 1 may also include a heat dissipator which dissipates heat caused by the semiconductor laser.

As such, although light source 50 includes the relatively large, heavy heat dissipator, light source 50 is disposed in fixture body 20, thereby allowing a reduction in size and weight of lamp 30. In other words, the center of gravity of lighting fixture 1 can be prevented from being located closer to second end 22 than first end 21. In other words, the force which is applied to body mount 70 disposed on first end 21 can be reduced. This obviates the need for a reinforcement member or the like in body mount 70, thereby simplifying the configuration of body mount 70.

Moreover, in lighting fixture 1, the heat dissipator may be accommodated in fixture body 20 closer to first end 21 than second end 22.

Moreover, in lighting fixture 1, the heat dissipator may be indirectly connected to the semiconductor laser.

Moreover, in lighting fixture 1, the center of gravity of light source 50 and the center of gravity of power supply 60 in fixture body 20 may be located offset toward first end 21 from the longitudinal center of fixture body 20.

This allows the center of gravity of lighting fixture 1 to be located closer to first end 21 than second end 22. In other words, the force which is applied to body mount 70 disposed on first end 21 can be reduced. Thus, the configuration of body mount 70 can be simplified.

Moreover, in lighting fixture 1, among the electronic components that are included in power supply 60, the heaviest electronic component may be accommodated in fixture body 20 closer to first end 21 than second end 22.

This allows the center of gravity of lighting fixture 1 to be located closer to first end 21 than second end 22. In other words, the force which is applied to body mount 70 disposed on first end 21 can be reduced. Thus, the configuration of body mount 70 can be simplified.

Moreover, lighting fixture 1 may further include support stem 40 disposed at the second end side and having lamp connection 42 to which lamp 30 is pivotally connected.

In this manner, lamp 30 can be caused to pivot about support stem 40, thereby enhancing an orientational degree of freedom of illumination light emitted by lamp 30.

Moreover, in lighting fixture 1, fixture body 20 may include a first through-hole at the second end side, support stem 40 may be connected to the second end side via the first through-hole and includes a second through-hole extending from the second end side to lamp 30, and exit end 12 of light guide 10 may be optically connected to lamp 30 via the first through-hole and the second through-hole.

Moreover, in lighting fixture 1, lamp 30 may include wavelength converter 32 configured to convert a wavelength of the laser light.

This allows the spectrum of illumination light emitted by lighting fixture 1 to be tailored.

Moreover, in lighting fixture 1, the laser light may be blue light having a wavelength of 420 nm or more and 500 nm or less.

In this case, lighting fixture 1 is allowed to emit white illumination light by using wavelength converter 32 which includes yellow phosphor, for example.

Moreover, in lighting fixture 1, body mount 70 may include mounting shaft 75 extending from fixture body 20 opposite lamp 30, mounting shaft 75 may include a pair of electrode plates 71 and 72 extending perpendicular to a central axis of mounting shaft 75 in opposite directions from mounting shaft 75, a pair of locking portions 73 and 74, and operating member 76 configured to pivot the pair of electrode plates 71 and 72 and locking portions 73 and 74 about the central axis of mounting shaft 75, whereby the pair of electrode plates 71 and 72 and locking portions 73 and 74 are configured to be provided in a power rail and pivoted about the central axis of mounting shaft 75 via operating member 76 to secure mounting shaft 75 to the power rail and provide power to power supply 60 via the pair of electrode plates 71 and 72.

Moreover, lighting fixture 1 for lamp 30 according to the present embodiment includes: fixture body 20 including an elongated shape, first end 21, second end 22, a first through-hole at first end 21 for receiving body mount 70, and a second through-hole at second end 22 for receiving lamp 30; light source 50 accommodated in fixture body 20 and configured to emit laser light; power supply 60 accommodated in fixture body 20 and electrically connected to light source 50; and light guide 10 accommodated in fixture body 20 and including entrance end 11 and exit end 12, entrance end 11 being optically connected to light source 50, exit end 12 extending through the second through-hole, light guide 10 configured to guide the laser light from light source 50 through the second through-hole and to exit end 12.

Moreover, in lighting fixture 1, a center of gravity of light source 50 and a center of gravity of power supply 60 in fixture body 20 may be located offset toward first end 21 from a longitudinal center of fixture body 20.

Moreover, in lighting fixture 1, light source 50 may include a semiconductor laser which emits the laser light, light source 50 may include a heat dissipator which dissipates heat caused by the semiconductor laser, the heat dissipator may be accommodated in fixture body 20 closer to first end 21 than second end 22, and power supply 60 may include a heaviest electronic component of power supply 60 being accommodated in fixture body 20 closer to first end 21 than second end 22.

Variations

While lighting fixture 1 according to the present disclosure has been described by way of the above embodiment, the present disclosure is not limited to the embodiment.

For example, the laser light source used in light source 50 may be other than the semiconductor laser. For example, the laser light source may be a solid state laser.

Moreover, wavelength converter 32 may be integral with light guide 10. In other words, light guide 10 may include, at exit end 12, wavelength converter 32 configured to convert a wavelength of the laser light. This obviates the need for alignment of the optical axes of light guide 10 and wavelength converter 32.

Moreover, lamp 30 may not essentially include wavelength converter 32. For example, lamp 30 may include a scattering member which scatters the laser light, or an optic, for example, for adjusting the spot size of the laser light, in place of wavelength converter 32.

Moreover, the laser light may be laser light other than blue light. For example, the laser light may be violet light having a wavelength of 380 nm or more and less than 420 nm. Alternatively, the laser light may be ultraviolet light having a wavelength of 300 nm or more and less than 380 nm.

Moreover, light source 50 may include a plurality of laser light sources. For example, light source 50 may include semiconductor lasers which emit laser light having different wavelengths. Further, the semiconductor lasers may be controlled independently of each other, and lamp 30 may emit combined light comprising the laser light emitted by the semiconductor lasers. In this case, wavelength converter 32 is not an essential component.

Moreover, lighting fixture 1 may be mounted on a mounted part other than lighting duct 110. In this case, the configuration of body mount 70 may be designed as appropriate, in accordance with the structure of the mounted part, for example.

Moreover, while the optical fiber is used as light guide 10 included in lighting fixture 1, a member other than the optical fiber may be used as light guide 10. For example, as light guide 10, an optic configured of a reflective member which propagates the laser light in a free space may be used, for example.

In other instances, various modifications to the exemplary embodiment according to the present disclosure described above that may be conceived by a person skilled in the art and embodiments implemented in any combination of the components and functions shown in the exemplary embodiment are also included within the scope of the present disclosure, without departing from the spirit of the present disclosure.

What is claimed is:

1. A lighting fixture, comprising:
   a fixture body including an elongated shape, a first end, and a second end;
   a body mount disposed at a first end side of the fixture body;
   a light source accommodated in the fixture body and configured to emit laser light;
   a power supply accommodated in the fixture body and electrically connected to the light source;
   a light guide accommodated in the fixture body and including an entrance end and an exit end, the entrance end being optically connected to the light source, the light guide configured to guide the laser light from the light source to the exit end; and
   a lamp disposed at a second end side of the fixture body and optically connected to the exit end of the light guide,
   wherein the laser light is blue light or violet light, the blue light having a wavelength of 420 nm or more and 500 nm or less, the violet light having a wavelength of 380 nm or more and less than 420 nm.

2. The lighting fixture according to claim 1, wherein the light source includes a semiconductor laser which emits the laser light.

3. The lighting fixture according to claim 2, wherein the light source includes a heat dissipator which dissipates heat caused by the semiconductor laser.

4. The lighting fixture according to claim 3, wherein the heat dissipator is accommodated in the fixture body closer to the first end than the second end.

5. The lighting fixture according to claim 4, wherein the heat dissipator is indirectly connected to the semiconductor laser.

6. The lighting fixture according to claim 2, wherein the semiconductor laser comprises a plurality of semiconductor lasers which emit laser light having different wavelengths.

7. The lighting fixture according to claim 6, wherein each of the plurality of semiconductor lasers is controlled independently, and
   the lamp is configured to emit the laser light including combined light emitted by the plurality of semiconductor lasers.

8. The lighting fixture according to claim 1, wherein a center of gravity of the light source and a center of gravity of the power supply in the fixture body are located offset toward the first end from a longitudinal center of the fixture body.

9. The lighting fixture according to claim 1, wherein the power supply includes a heaviest electronic component being accommodated in the fixture body closer to the first end than second end.

10. The lighting fixture according to claim 1, further comprising:
    a support stem disposed at the second end side and having a lamp connection to which the lamp is pivotally connected.

11. The lighting fixture according to claim 10, wherein the fixture body includes a first through-hole at the second end side,
    the support stem is connected to the second end side via the first through-hole and includes a second through-hole extending from the second end side to the lamp, and
    the exit end of the light guide is optically connected to the lamp via the first through-hole and the second through-hole.

12. The lighting fixture according to claim 1, wherein the lamp includes a wavelength converter configured to convert a wavelength of the laser light.

13. The lighting fixture according to claim 1, wherein the light guide includes, at the exit end, a wavelength converter configured to convert a wavelength of the laser light.

14. The lighting fixture according to claim 1, wherein the laser light is the blue light having the wavelength of 420 nm or more and 500 nm or less.

15. The lighting fixture according to claim 1, wherein the laser light is the violet light having the wavelength of 380 nm or more and less than 420 nm.

16. The lighting fixture according to claim 1, wherein the body mount includes a mounting shaft extending from the fixture body opposite the lamp,
    the mounting shaft includes a pair of electrode plates extending perpendicular to a central axis of the mounting shaft in opposite directions from the mounting shaft, a pair of locking portions, and an operating member configured to pivot the pair of electrode plates and the locking portions about the central axis of the mounting shaft,
    whereby the pair of electrode plates and the locking portions are configured to be provided in a power rail and pivoted about the central axis of the mounting shaft via the operating member to secure the mounting shaft to the power rail and provide power to the power supply via the pair of electrode plates.

17. A lighting fixture for a lamp, the lighting fixture comprising:
    a fixture body including an elongated shape, a first end, a second end, a first through-hole at the first end for receiving a body mount, and a second through-hole at the second end for receiving a lamp;
    a light source accommodated in the fixture body and configured to emit laser light;
    a power supply accommodated in the fixture body and electrically connected to the light source; and
    a light guide accommodated in the fixture body and including an entrance end and an exit end, the entrance end being optically connected to the light source, the exit end extending through the second through-hole, the light guide configured to guide the laser light from the light source through the second through-hole and to the exit end, wherein the laser light is blue light or violet light, the blue light having a wavelength of 420 nm or more and 500 nm or less, the violet light having a wavelength of 380 nm or more and less than 420 nm.

18. The lighting fixture according to claim 17, wherein a center of gravity of the light source and a center of gravity of the power supply in the fixture body are located offset toward the first end from a longitudinal center of the fixture body.

19. The lighting fixture according to claim 18, wherein the light source includes a semiconductor laser which emits the laser light, the light source includes a heat dissipator which dissipates heat caused by the semiconductor laser, the heat dissipator is accommodated in the fixture body closer to the first end than the second end, and the power supply includes a heaviest electronic component of the power supply being accommodated in the fixture body closer to the first end than the second end.

* * * * *